(12) United States Patent
Mizuno et al.

(10) Patent No.: US 8,093,086 B2
(45) Date of Patent: Jan. 10, 2012

(54) PACKAGED DEVICE AND METHOD OF MANUFACTURING THE SAME

(75) Inventors: Yoshihiro Mizuno, Kawasaki (JP); Norinao Kouma, Kawasaki (JP); Hisao Okuda, Kawasaki (JP); Hiromitsu Soneda, Kawasaki (JP); Tsuyoshi Matsumoto, Kawasaki (JP); Osamu Tsuboi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/020,101

(22) Filed: Feb. 3, 2011

(65) Prior Publication Data

US 2011/0124143 A1    May 26, 2011

Related U.S. Application Data

(62) Division of application No. 12/164,670, filed on Jun. 30, 2008, now Pat. No. 7,906,822.

(30) Foreign Application Priority Data

Jun. 29, 2007  (JP) .................. 2007-173077

(51) Int. Cl.
*H01L 21/52* (2006.01)
(52) U.S. Cl. ...................... 438/51; 257/E21.5

(58) Field of Classification Search ................ 438/106, 438/51; 257/415, 678, 774, E21.5
See application file for complete search history.

(56) References Cited

U.S. PATENT DOCUMENTS

| 4,323,914 | A   | * | 4/1982  | Berndlmaier et al. ........ 257/713 |
| 6,614,029 | B2  |   | 9/2003  | Asjes |
| 6,640,613 | B2  | * | 11/2003 | Rapp et al. .................... 73/24.01 |
| 6,956,283 | B1  |   | 10/2005 | Peterson |
| 7,199,439 | B2  |   | 4/2007  | Farnworth et al. |
| 2004/0018421 | A1 | * | 1/2004 | LaFollette et al. ............ 429/122 |
| 2004/0053124 | A1 | * | 3/2004 | LaFollette et al. ............ 429/149 |
| 2008/0122055 | A1 |   | 5/2008 | Perkins |
| 2009/0102067 | A1 | * | 4/2009 | Wyland ........................ 257/784 |
| 2009/0216149 | A1 |   | 8/2009 | Neff et al. |

FOREIGN PATENT DOCUMENTS

| JP | 2003-019700 A | 1/2003 |
| JP | 2003-512621 A | 4/2003 |
| JP | 2003-172782 A | 6/2003 |
| JP | 2004-341364 A | 12/2004 |
| JP | 2005-504419 A | 2/2005 |
| JP | 2006-072252 A | 3/2006 |

\* cited by examiner

*Primary Examiner* — Tho Le
(74) *Attorney, Agent, or Firm* — Westerman, Hattori, Daniels & Adrian, LLP

(57) ABSTRACT

A packaged device includes a package having an inner surface defining a closed internal space, a device chip fixed to the package in the internal space, and a parylene film covering at least a part of the inner surface of the package and/or at least a part of a surface of the device chip.

7 Claims, 17 Drawing Sheets

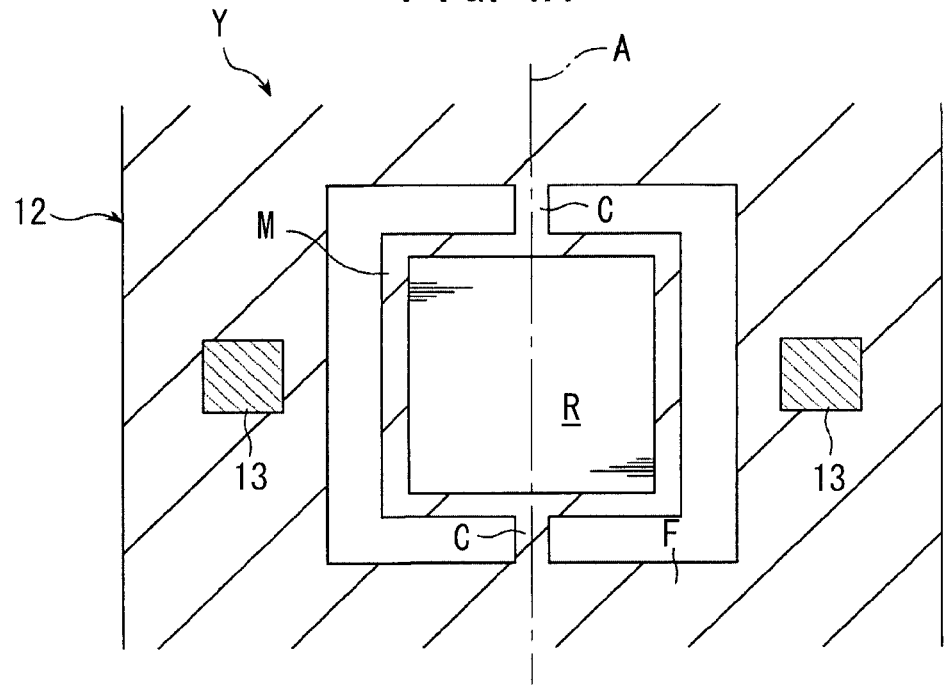
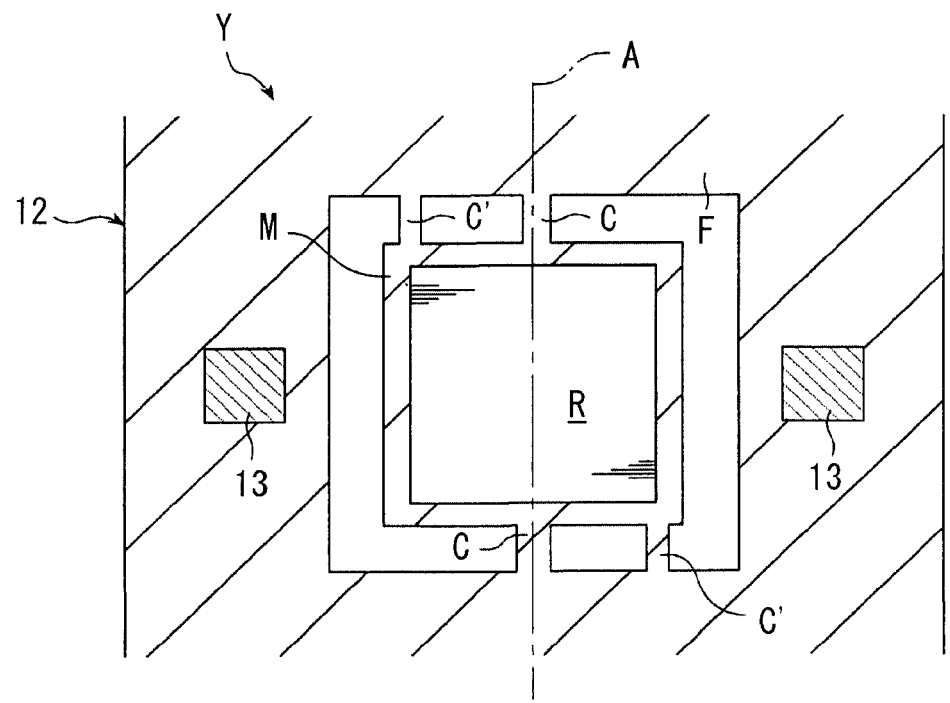

ial Field
The present embodiment relates to a packaged device in
PACKAGED DEVICE AND METHOD OF MANUFACTURING THE SAME

CROSS-REFERENCE TO RELATED APPLICATION

This application is a divisional of U.S. application Ser. No. 12/164,670, filed on Jun. 30, 2008 which is based upon and claims the benefit of priority from the prior Japanese patent application no. 2007-173077 filed on Jun. 29, 2007, in the Japan Patent Office, and incorporated by reference herein.

BACKGROUND OF THE INVENTION

1. Technical Field

The present embodiment relates to a packaged device in which a device chip such as a micro movable element is sealed, and a method of manufacturing the packaged device.

2. Background of the Art

In recent years, elements or devices having micro structures formed utilizing MEMS (Micro-ElectroMechanical Systems) techniques have been applied in various technical fields. These devices include micro movable elements having micro movable portions, for example, micro mirrors, angular speed sensors, and acceleration sensors. The micro mirror is utilized in the fields of, for example, optical disk techniques and optical communication techniques as a device providing a light reflecting function. The angular speed sensor and the acceleration sensor are utilized for various applications; for example, these sensors are used to provide a hand jiggling preventing function for video cameras or cellular phones with cameras and used for car navigation systems, air bag open timing systems, and posture control systems for cars, robots, or the like. The micro movable element is described in, for example, Japanese Patent Laid-Open Nos. 2003-19700, 2004-341364, and 2006-72252.

The micro movable element comprises, for example, a movable portion that is, for example, swingable, a fixed portion, a coupling portion that couples the movable portion and the fixed portion together, and a driving electrode pair that drives the movable portion. A package in which a device chip with such a micro movable element formed sealed therein needs to maintain the amount of moisture in an internal space in which the micro movable element or the device chip is accommodated, at a given value or less (for example, at most 5,000 ppm). A large amount of moisture in the internal space may induce discharging in the vicinity of a driving electrode for the micro movable element. The induced discharging may degrade the electrical or driving characteristics of the element. A small amount of moisture is contained in or attached to the package member or the device chip. The moisture evaporates to the internal space to increase the amount of moisture in the internal space, which may exceed an allowable level.

Moisture absorbents exerting a chemical or physical moisture absorbing effect are conventionally used in order to maintain the amount of moisture in the internal space in the package at a low level. For example, a paste-like moisture absorbent is applied to a predetermined position in the internal space in the package and then dried. The moisture absorbent is thus provided in the internal space together with the device chip.

However, to make the moisture absorbent available, it is necessary to provide not only a device chip mounting area but also an arrangement area for the moisture absorbent. The size of the arrangement area tends to increase consistently with the amount of moisture absorbent. Thus, the use of the moisture absorbent is not preferable for a reduction in package size. Furthermore, the moisture absorbing effect of the moisture absorbent is likely to be temporally degraded. This makes it difficult to reliably keep the amount of moisture in the internal space at a low level.

SUMMARY

According to an aspect of an embodiment, a packaged device includes a package having an inner surface defining a closed internal space; a device chip fixed to the package in the internal space; and a parylene film covering at least a part of the inner surface of the package and/or at least a part of a surface of the device chip.

According to another aspect of an embodiment, a method of manufacturing a packaged device includes a mounting step of mounting a device chip in a recess portion of a package main body having an electrode pad in the recess portion; a connecting step of electrically connecting the device chip and the electrode pad together using a wiring component; a coating step of depositing parylene in the recess portion of the package main body; and a joining step of joining a cover closing the recess portion, to the package main body.

According to still another aspect of an embodiment, a method of manufacturing a packaged device includes a step of vapor-depositing parylene in a recess portion of a package main body having an electrode pad in the recess portion; a step of removing the parylene from the electrode pad; a step of mounting a device chip in the recess portion of the package main body; a connecting step of electrically connecting the device chip and the electrode pad together using a wiring component; and a joining step of joining a cover closing the recess portion, to the package main body.

BRIEF DESCRIPTION OF THE DRAWINGS

FIGS. 4A and 4B are enlarged plan views showing a micro mirror element;

DETAILED DESCRIPTION OF THE EMBODIMENT

Figure 1:
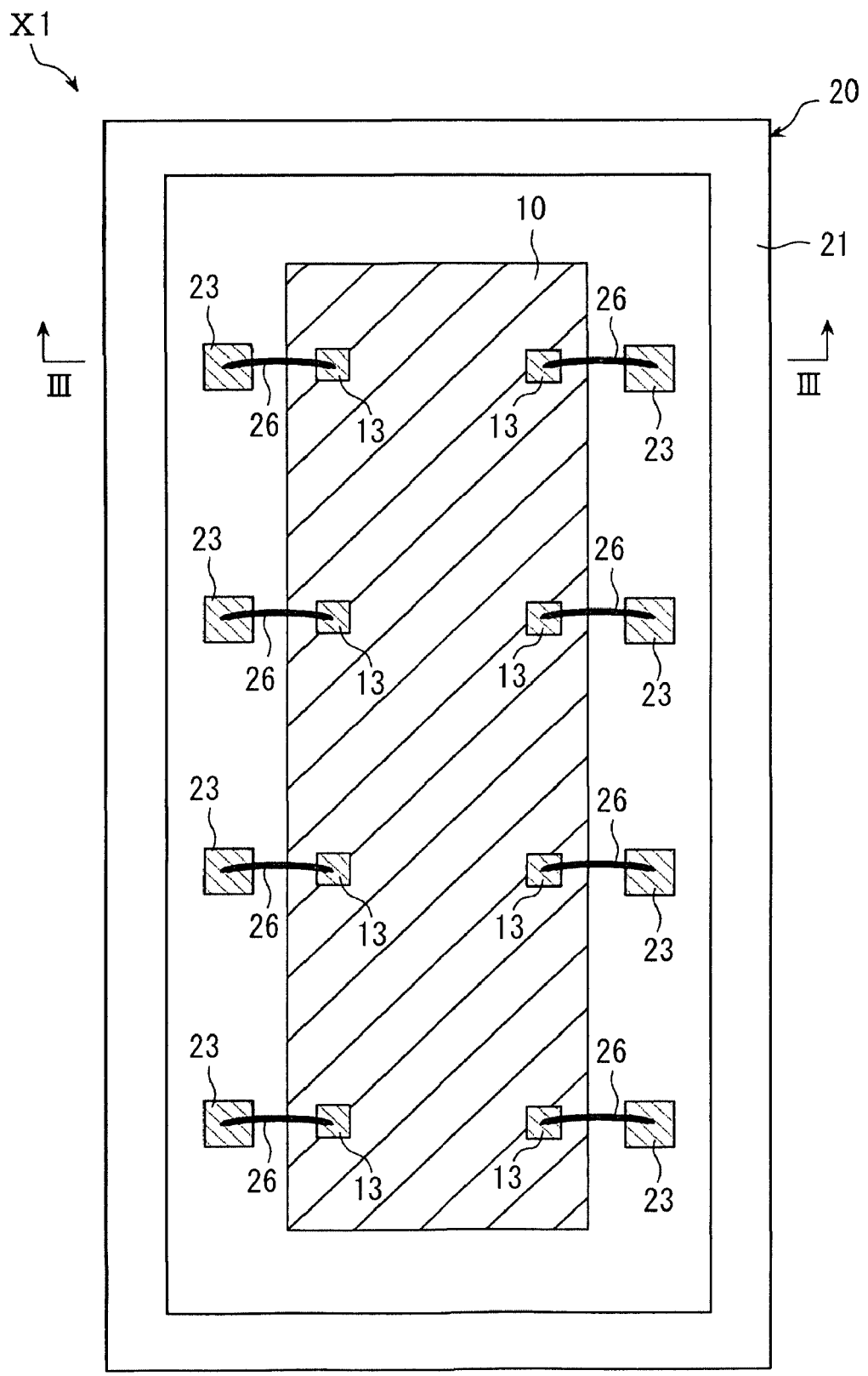
FIG. 1 is a (partly omitted) plan view of a packaged device according to a first aspect of the present embodiment.
Figure 2:
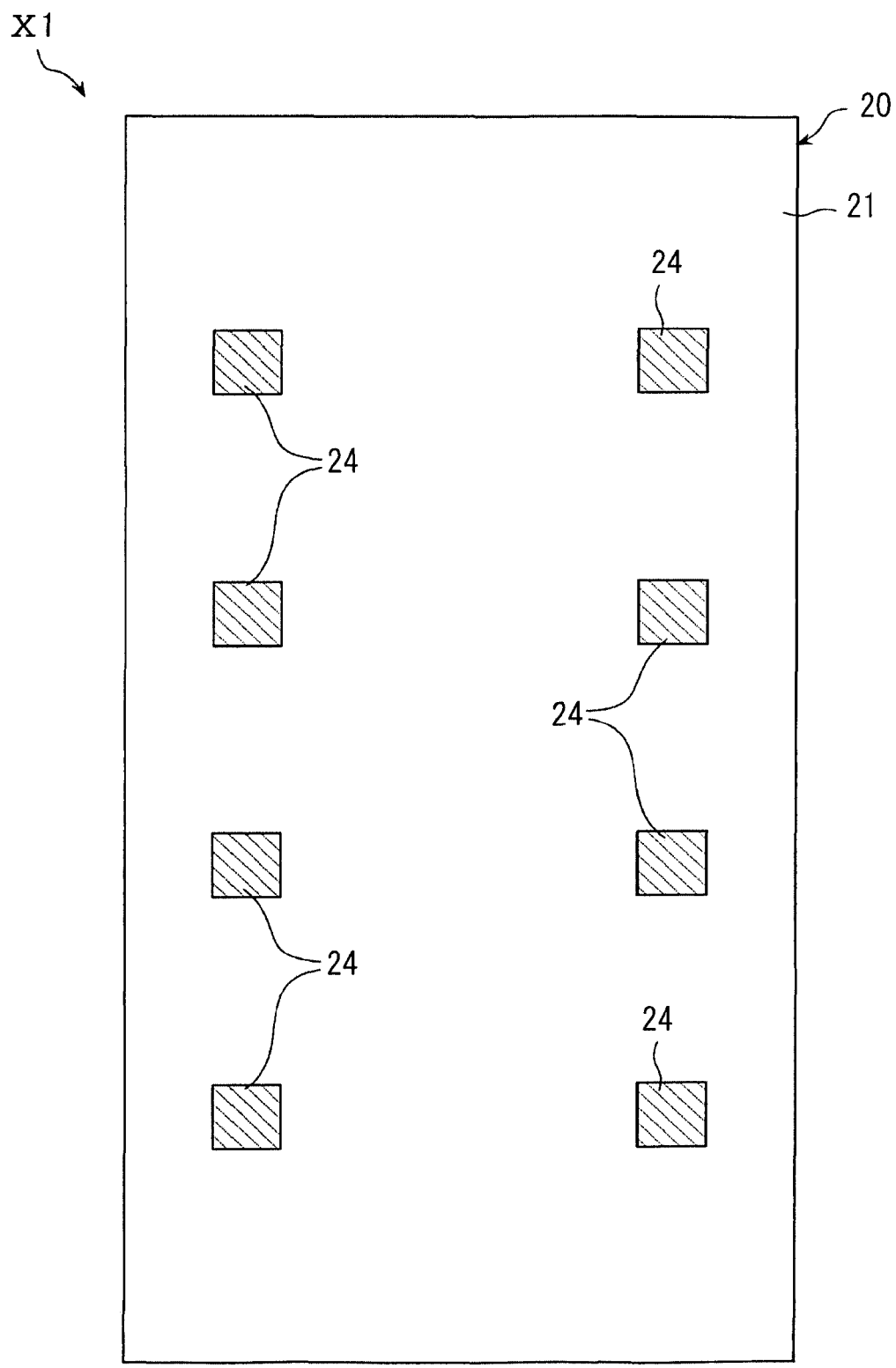
FIG. 2 is another plan view of the package device according to the first aspect of the present embodiment.
Figure 3:
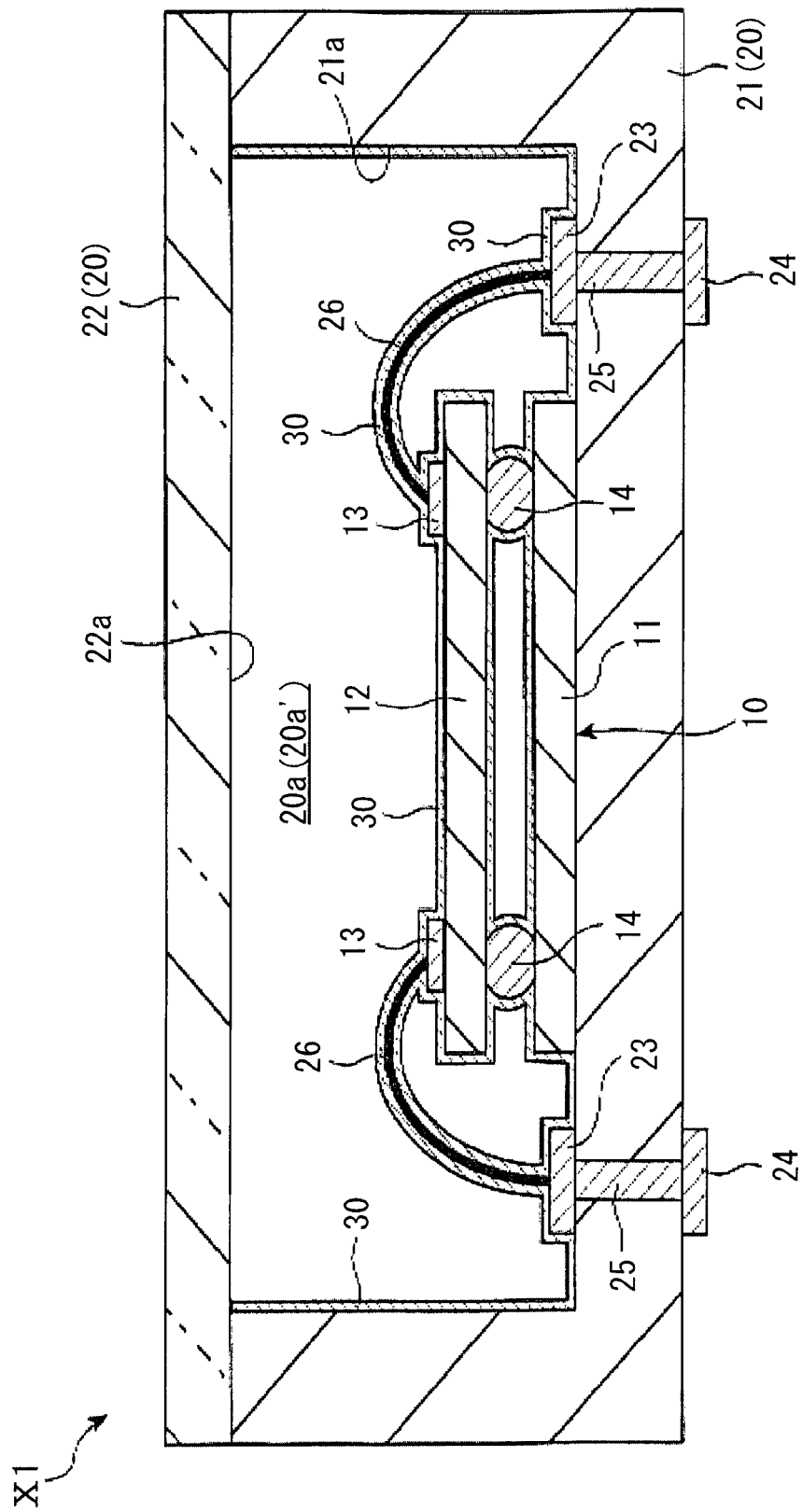
FIG. 3 is an enlarged sectional view of the packaged device taken along line III-III in FIG. 1.

FIGS. 1 to 3 show a packaged device X1 according to a first aspect of the present embodiment. FIG. 1 is a (partly omitted) plan view of the packaged device X1. FIG. 2 is another plan view of the packaged device X1. FIG. 3 is a sectional view of the packaged device taken along line III-III in FIG. 1.

The packaged device X1 includes a device chip 10, a package 20, and a parylene film 30 (not shown in FIG. 1).

In the present aspect, the device chip 10 is what is called a MEMS mirror device. The device chip 10 includes a base substrate 11, a mirror substrate 12, and electrode pads 13. The base substrate 11 and the mirror substrate 12 are joined together via bumps 14. A plurality of micro mirror elements (not shown in FIGS. 1 and 3) are formed in the mirror substrate 12. The plurality of micro mirror elements are formed by processing an SOI (Silicon On Insulator) substrate by a MEMS technique.

FIG. 4A shows a micro mirror element Y formed in the mirror substrate 12. The micro mirror element Y has a frame F, a swingable movable portion M, coupling portions C that couple the frame F and the movable portion M together to define an axis A for a swinging operation of the movable portion M, and a predetermined driving electrode pair (not shown) that drives the movable portion M. A mirror surface R capable of reflecting light is provided on the movable portion M. A plurality of the micro mirror elements Y are arranged on the mirror substrate 12, for example, in a line. In each of the micro mirror elements Y, the movable portion M can be rotationally displaced around the axis A by applying a predetermined voltage to between the paired driving electrodes. The amount of rotational displacement of the movable portion M can be adjusted by controlling the applied voltage. The swingable driving of the movable portion M enables the appropriate switching of a direction in which light is reflected by the mirror surface R on each of the movable portions M.

The package 20 is made up of a packaging member 21 that is a package main body and a packaging member 22 (not shown in FIG. 1) that is a package cover. The packaging member 21 is made up of a ceramic material and has a recess portion 20a'. The packaging member 22 is a translucent, optical glass plate. The packaging members 21 and 22 are joined together so as to close the recess portion 20a' of the packaging member 21. The packaging members 21 and 22 form a closed internal space 20a. The packaging members 21 and 22 have inner surfaces 21a and 22a defining the internal space 20a. Electrode pads 23 are provided in the internal space 20a in the packaging member 21. Electrode pads 24 are provided on an outer portion of the packaging member 21 as shown in FIGS. 2 and 3. The electrode pads 23 and 24 are electrically connected together by plugs 25 buried in the packaging member 21.

The above-described device chip 10 is fixed to the package 20 in the internal space 20a. The electrode pads 13 on the device chip 10 are electrically connected to the electrode pads 23 in the package 20 or packaging member 21 via wires 26. Light entering the package 20 via the packaging member 22 is reflected by the mirror surface R, shown in FIG. 4A, of each of the micro mirror elements Y in the device chip 10. The light then exits the package 20 via the packaging member 22.

The parylene film 30 is made up of a polymeric paraxylylene resin. The parylene film 30 is a coating film (conformal coating film) having a small and uniform thickness. The thickness of the parylene film 30 is, for example, 0.05 to 1.15 μm. In the present aspect, the parylene film 30 coats the device chip 10, the inner surface 21a of the packaging member 21, the electrode pads 23, and the wires 26 as shown in FIG. 3. Specifically, the parylene film 30 conformally covers a part of the surface of the device chip 10, a part of the inner surface 21a of the packaging member 21, a part of the surface of each of the electrode pads 23, and a part of the surface of each of the wires 26.

Figure 5A:
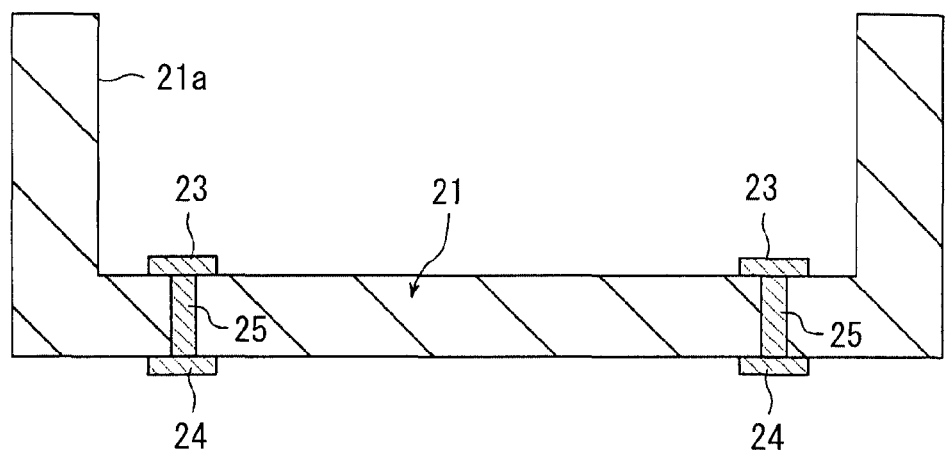
FIGS. 5A and 5B are diagrams showing steps of a method of manufacturing the packaged device shown in FIG. 1.
Figure 5B:
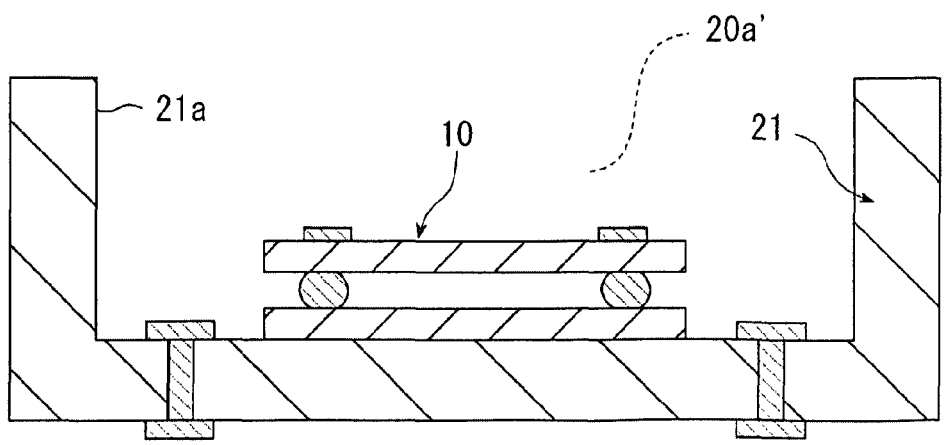

FIGS. 5 to 7 show a method of manufacturing the packaged device X1. The packaged device X1 is manufactured as described below. First, as shown in FIG. 5A, the electrode pads 23 and 24 and the plugs 25 are formed in the packaging member 21. Then, as shown in FIG. 5B, the device chip 10 is mounted in the packaging member 21 (mounting step). In the present step, for example, an Ag paste is applied to a predetermined mounting surface (a part of the inner surface 21a) in the recess portion 20a' of the packaging member 21. Then, the device chip 10 is die-bonded to the mounting surface. Subsequently, a heating treatment is performed to harden the Ag paste. As shown in FIG. 4B, the frame F and movable portion M in the device chip 10 are coupled together not only by the coupling portions C but also by temporary support portions C'. The temporary support portions C' are cut away or removed before the use of the micro mirror element Y. The temporary support portions C' provide a function of fixing the movable portion M to the frame F or a function of reinforcing the coupling between the movable portion M and the frame F until the temporary support portions C' are cut away.

Figure 6A:
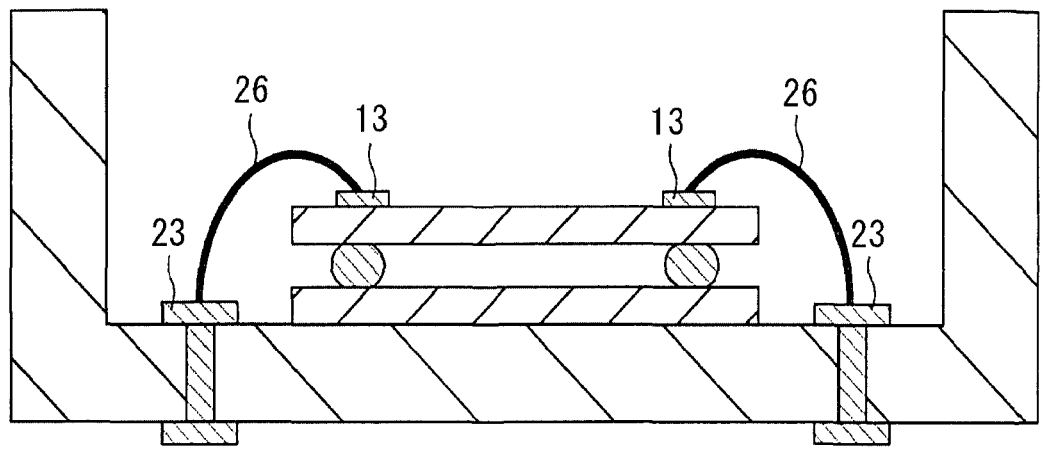
FIGS. 6A and 6B are diagrams showing steps following the one shown in FIG. 5B.
Figure 6B:
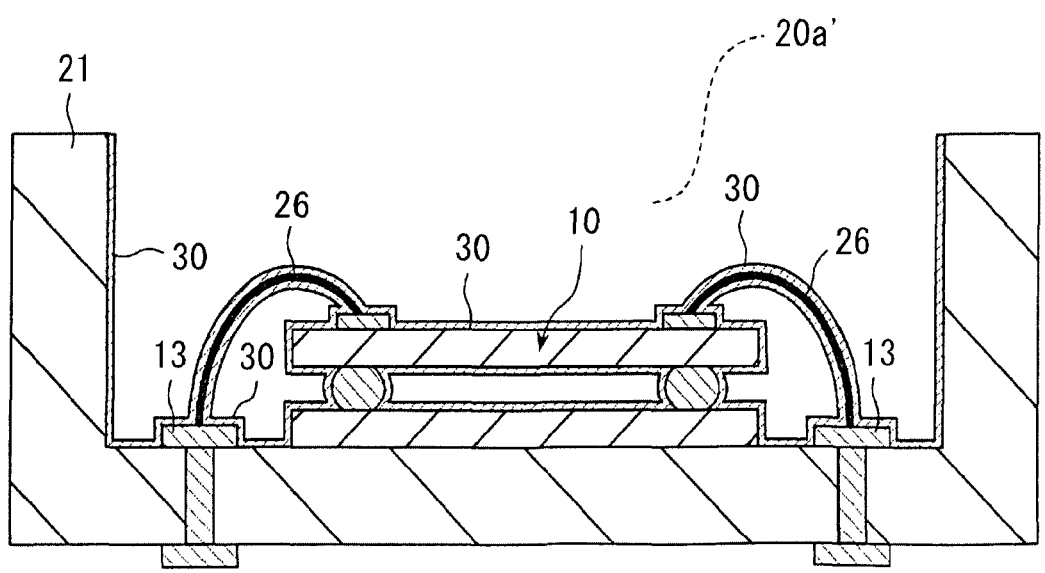

Then, as shown in FIG. 6A, the wires 26 are formed (connecting step). The wires 26, connecting the electrode pads 13 and 23 together, are formed by, for example, wire bonding. Then, as shown in FIG. 6B, parylene is vapor-deposited in the recess portion 20a' of the packaging member 21 to form the parylene film 30 (coating step). More specifically, the parylene film 30 is formed by polymerizing a paraxylylene monomer on a surface of an object by vapor deposition. The parylene film 30 is made up of a polymeric paraxylylene film. The parylene film 30 is formed by polymerizing a gas of the monomer of a light molecular weight on the surface of the object. The parylene film 30 is a coating film (conformal coating film) shaped to trace the fine recessed and protruding shape of the surface of the object and having a small and uniform film thickness.

Figure 7A:
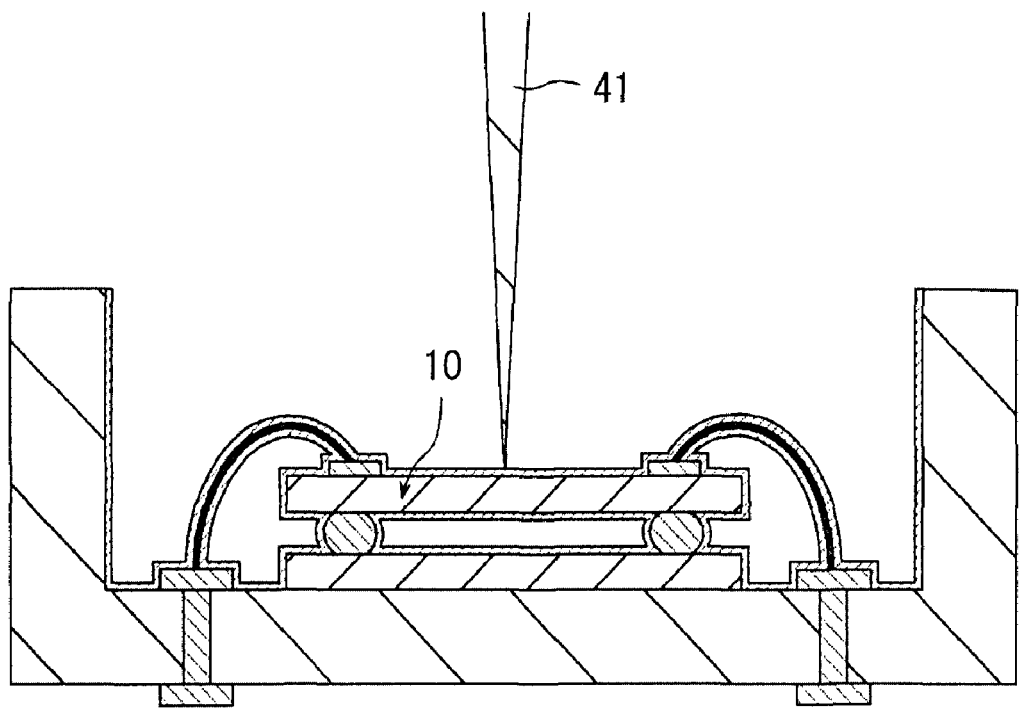
FIGS. 7A and 7B are diagrams showing steps following the one shown in FIG. 6B.
Figure 7B:
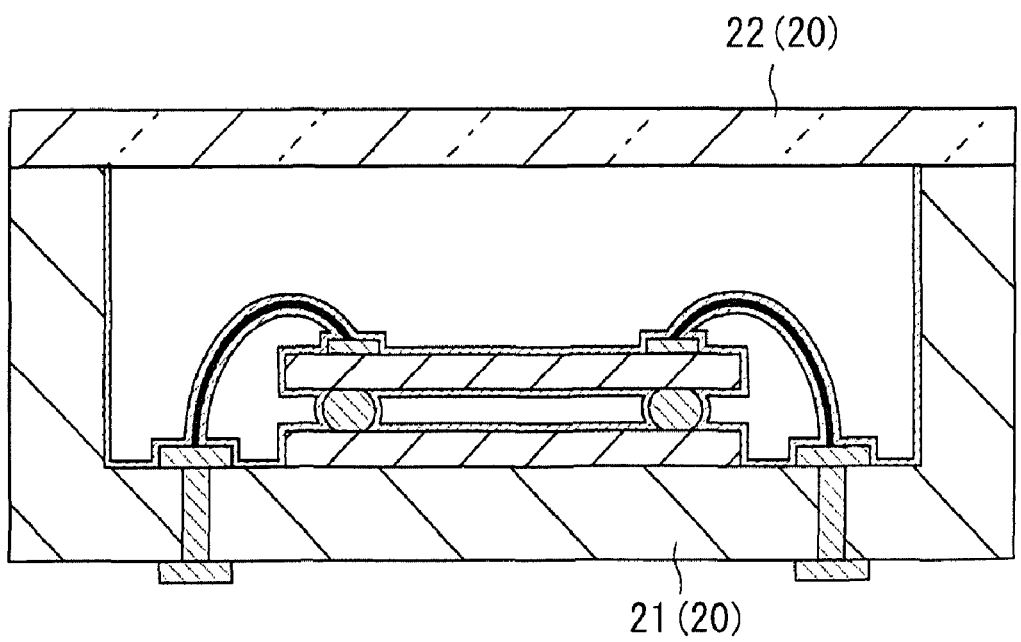

Then, the temporary support portions C', shown in FIG. 4B and coupling the frame F to the movable portion M in each of the micro member elements Y in the device chip 10, are cut away or removed by irradiation with a laser beam 41 (cutting step) as shown in FIG. 7A. Thus, as shown in FIG. 4A, the frame F and the movable portion M are coupled together only by the coupling portions C. This makes the movable portion M swingable around the axis A. A YAG laser can be adopted as the laser beam 41. Then, as shown in FIG. 7B, the packaging members 21 and 22 are joined together (joining step). For example, the packaging members 21 and 22 are joined together by interposing a predetermined joining agent between the packaging members 21 and 22.

The packaged device X1 can be manufactured as described above. Predetermined connectors each provided at the tip of a flexible cable are attached as required to a side of the packaged device X1 shown in FIG. 2. The connectors are electrically connected to the electrode pads 24 or the packaged device X1. Furthermore, in the present method, the cutting step described above with reference to FIG. 7A may be carried out after the connecting step described above with reference to FIG. 6A and before the coating step described above with reference to FIG. 6B. In this case, after the coating step, the joining step described above with reference to FIG. 7B is carried out without performing the cutting step described above with reference to FIG. 7A. By carrying out the coating step after the cutting step, it is possible, in the coating step, to fix, by the parylene film 30, fragments of the material that may remain in the recess portion 20a' as a result of the irradiation with the laser beam in the cutting step.

In the packaged device X1, as described above, the parylene film 30 coats the device chip 10, the inner surface 21a of the packaging member 21, the electrode pads 23, and the wires 26 as shown in FIG. 3. Specifically, the parylene film 30 covers a part of the surface of the device chip 10, a part of the inner surface 21a of the packaging member 21, a part of the surface of each of the electrode pads 23, and a part of the surface of each of the wires 26. The parylene film 30 is excellent in gas impermeability, water repellency, and water resistance. Moisture (water vapor) cannot substantially pass through the parylene film 30. This inhibits a small amount of moisture contained in or attached to the packaging member 21 or the device chip 10 from evaporating to the internal space 20a in the package 20. Consequently, the moisture level of the internal space 20a is suppressed. In addition, the parylene film 30 is a conformal coating film as described above. This makes the present aspect different from the conventional technique utilizing the moisture absorbing agent and thus reduces the amount of the arrangement area required for the moisture absorbing agent. The parylene film 30 is thus preferable for a reduction in package size. As described above, the packaged device X1 can exert the moisture inhibiting effect in the internal space 20a in the package 20 without inhibiting a reduction in package size.

Figure 8A:
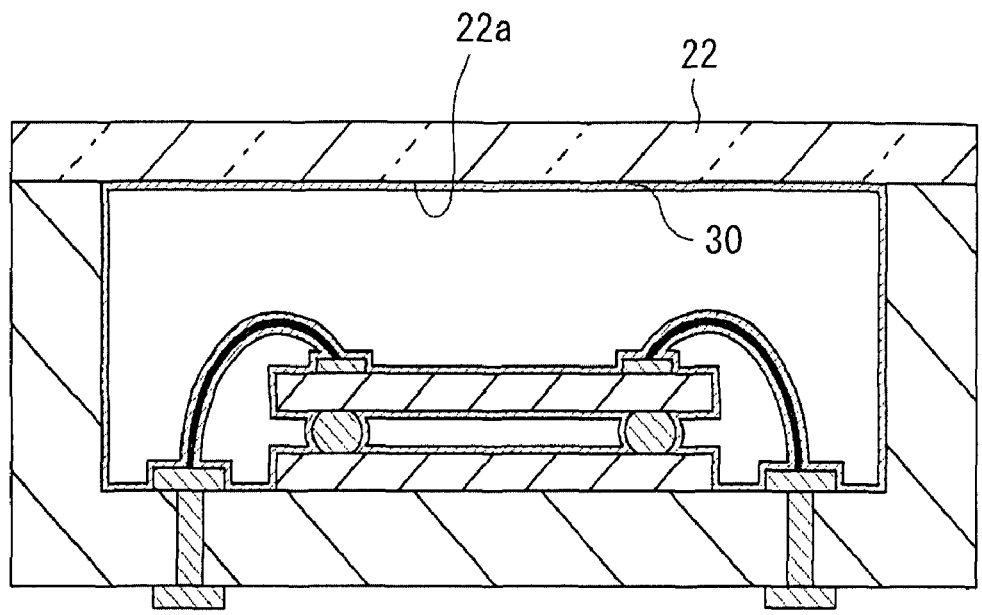
FIGS. 8A and 8B are sectional views of a variation of the packaged device according to the first aspect.

As shown in FIG. 8A, the packaged device X1 may cover the entire inner surface 22a of the packaging member 22 (optical glass plate) with the parylene film 30. This configuration can easily exert a significant moisture inhibiting effect. To manufacture the packaged device X1 shown in FIG. 8A, the parylene film 30 covering the inner surface 22a of the packaging member 22 is formed before the joining step described above with reference to FIG. 7B. To form the parylene film 30 on the inner surface 22a, for example, a capton tape P-221 (manufactured by Permacel) is stuck to the junction between the packaging member 22 and the packaging member 21. Then, parylene is vapor-deposited on the inner surface 22a of the packaging member 22. Subsequently, the tape is peeled off.

Figure 8B:
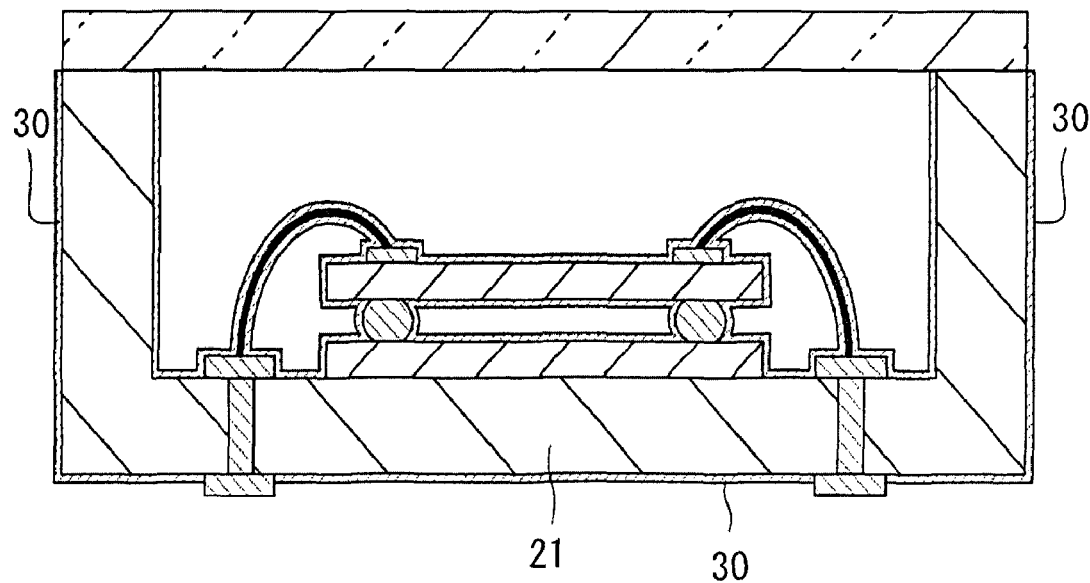

In the packaged device X1, an outer surface of the package 20 may be covered with the parylene film 30 as shown in FIG. 8B. This configuration can inhibit external moisture from entering the package. To manufacture the packaged device X1 shown in FIG. 8B, the parylene film 30 covering the outer surface of the packaging member 21 is formed before the mounting step described above with reference to FIG. 5B. To form the parylene film 30 on the outer surface, for example, the capton tape P-221 (manufactured by Permacel) is stuck to the surface of each of the electrode pads 24. Then, parylene is vapor-deposited on the outer surface of the packaging member 21. Subsequently, the tape is peeled off.

Figure 9:
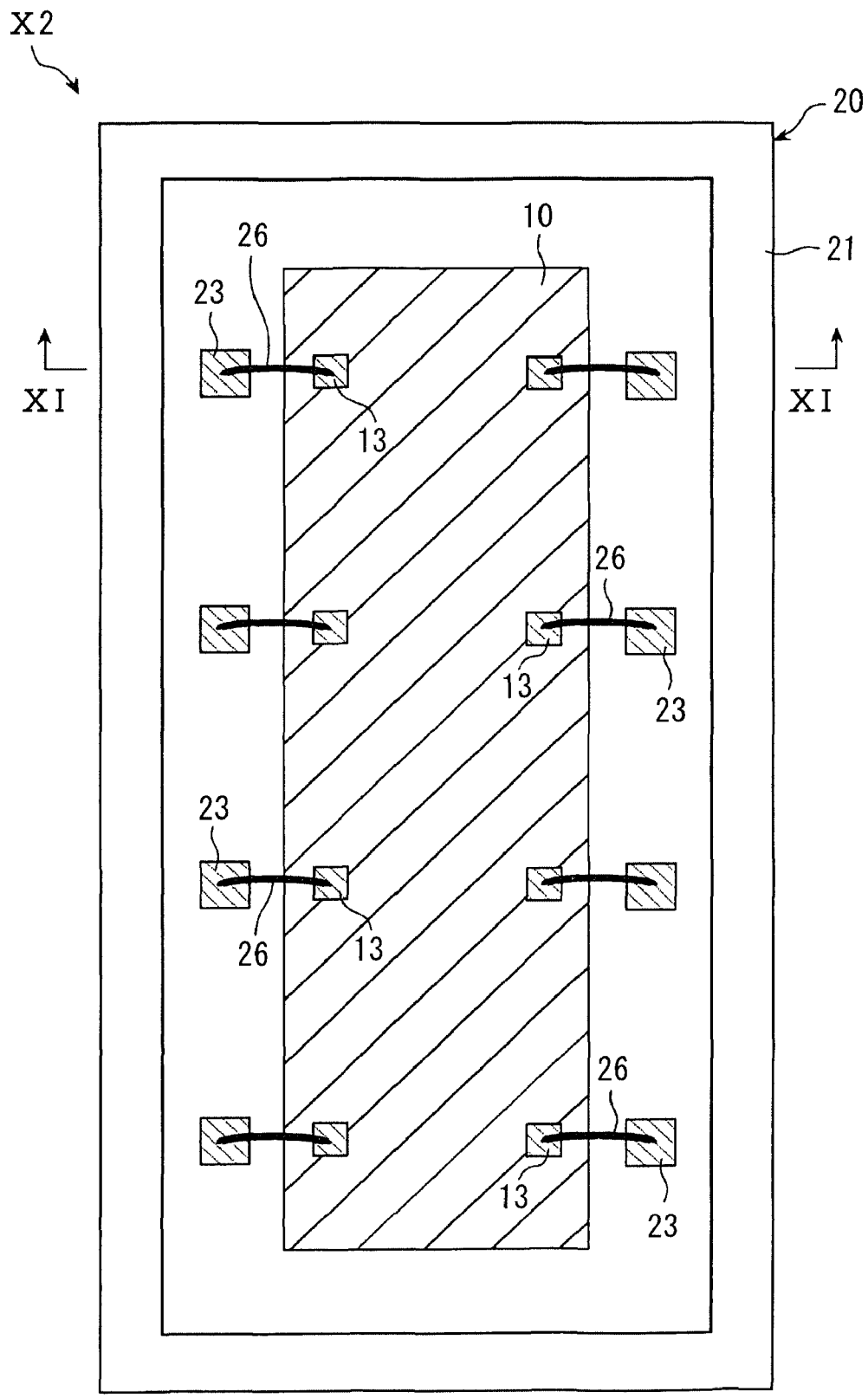
FIG. 9 is a (partly omitted) plan view of a packaged device according to a second aspect of the present embodiment.
Figure 10:
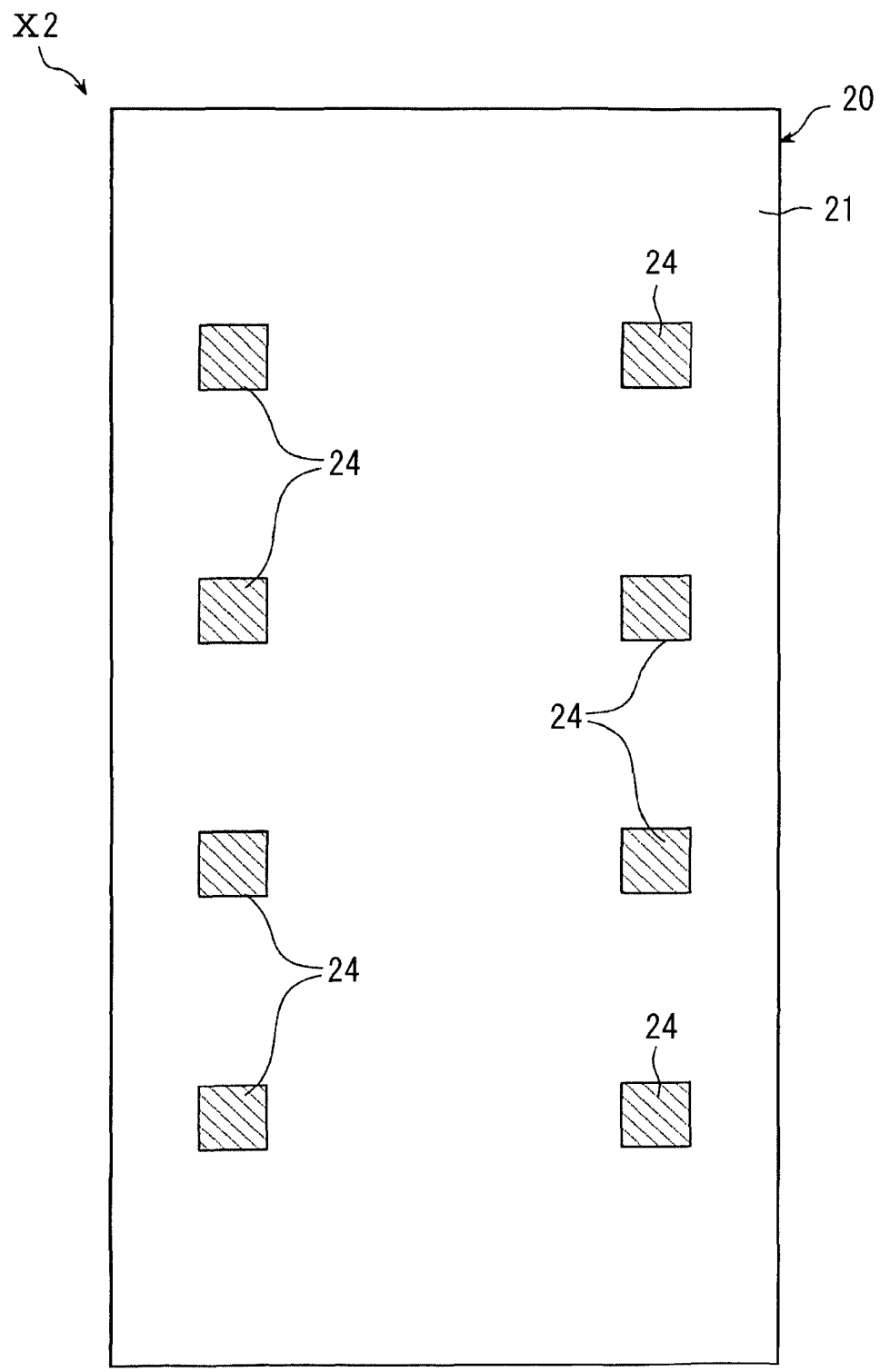
FIG. 10 is another plan view of the packaged device according to the second aspect of the present embodiment.
Figure 11:
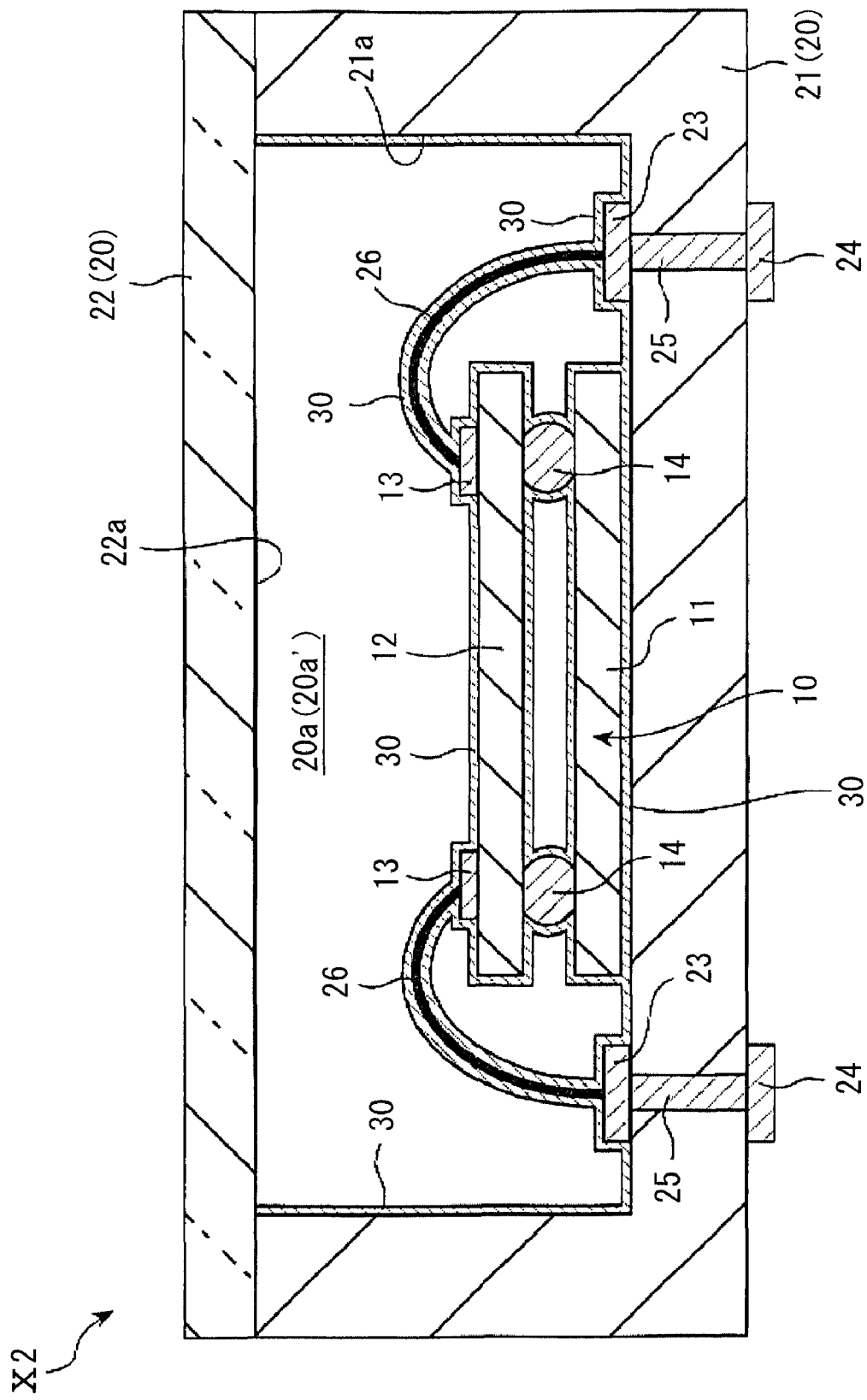
FIG. 11 is an enlarged sectional view taken along line XI-XI in FIG. 9.

FIGS. 9 to 11 show a packaged device X2 according to a second aspect of the present embodiment. FIG. 9 is a (partly omitted) plan view of the packaged device X2. FIG. 10 is another plan view of the packaged device X2. FIG. 11 is a sectional view of the packaged device X2 taken along line XI-XI in FIG. 9.

The packaged device X2 comprises a device chip 10, a package 20, and a parylene film 30. The device chip 10 includes a base substrate 11, a mirror substrate 12, and electrode pads 13. A plurality of the micro mirror elements Y (not shown in FIGS. 9 and 11) are formed in the mirror substrate 12. The package 20 is made up of a packaging member 21 that is a package main body and a packaging member 22 that is a package cover. The package 20 has a closed internal space 20a. The electrode pads 23 are provided in the internal space 20a in the packaging member 21. As shown in FIGS. 10 and 11, electrode pads 24 are provided on an outer portion of the packaging member 21. The packaging member 22 is a translucent, optical glass plate. The device chip 10 is fixed to the package 20 in the internal space 20a. The electrode pads 13 on the device chip 10 are electrically connected to the electrode pads 23 via wires 26. The parylene film 30 is made up of a polymeric paraxylylene resin. The parylene film 30 is a coating film (conformal coating film) having a small and uniform thickness.

The packaged device X2 is different from the packaged device X1 in that the parylene film 30 is interposed at the junction between the device chip 10 and the packaging member 21. For reasons similar to those described above for the packaged device X1, the packaged device X2 can exert the moisture inhibiting effect in the internal space 20a in the package 20 without inhibiting a reduction in package size. The packaged device X2 tends to exert a more significant moisture inhibiting effect than the packaged device X1. In the packaged device X2, the parylene 30 also coats the packaging member 21 at the junction between the device chip 10 and the packaging member 21. Thus, the packaged device X2 inhibits the evaporation of a small amount of moisture contained in or attached to the packaging member 21 to the internal space 20a in the package 20, more effectively than the packaged device X1.

Figure 12A:
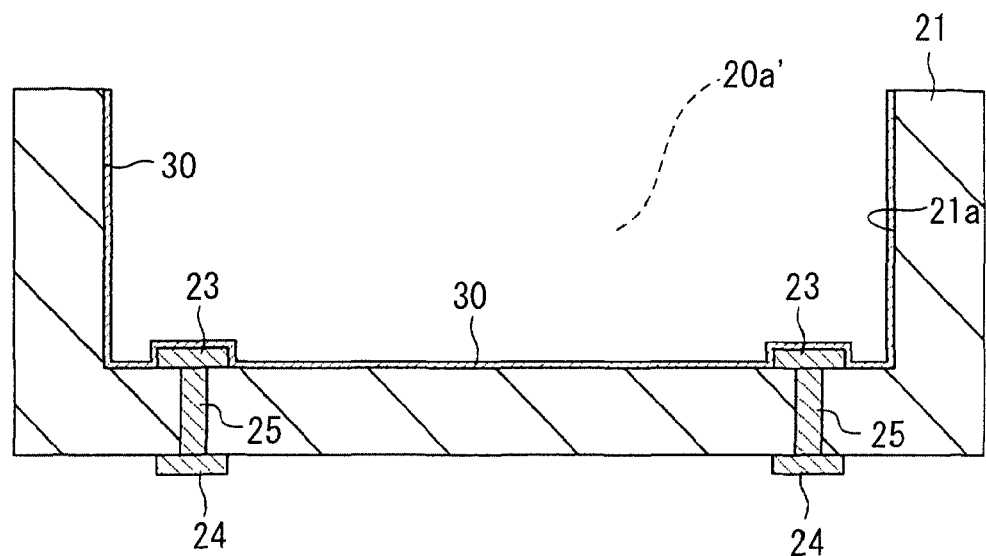
FIGS. 12A and 12B are diagrams showing steps of a first method of manufacturing the packaged device shown in FIG. 9.
Figure 12B:
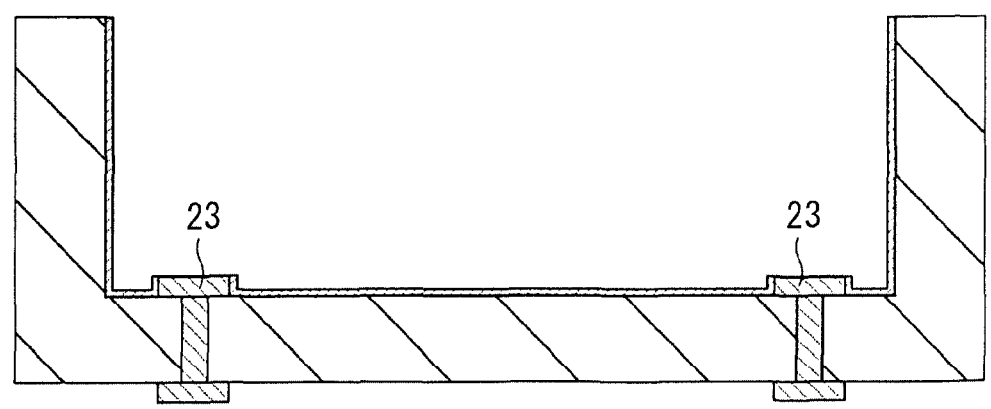

FIGS. 12 to 14 show a first method of manufacturing the packaged device X2. In the present manufacturing method, first, the electrode pads 23 and 24 and the plugs 25 are formed in the packaging member 21 as shown in FIG. 12A. Subsequently, parylene is vapor-deposited in the recess portion 20a of the packaging member 21 to form the parylene film 30 (first coating step). Then, as shown in FIG. 12B, the parylene film 30 is removed from the electrode pads 23 by irradiation with a laser beam. An excimer laser can be adopted as the laser beam.

Figure 13A:
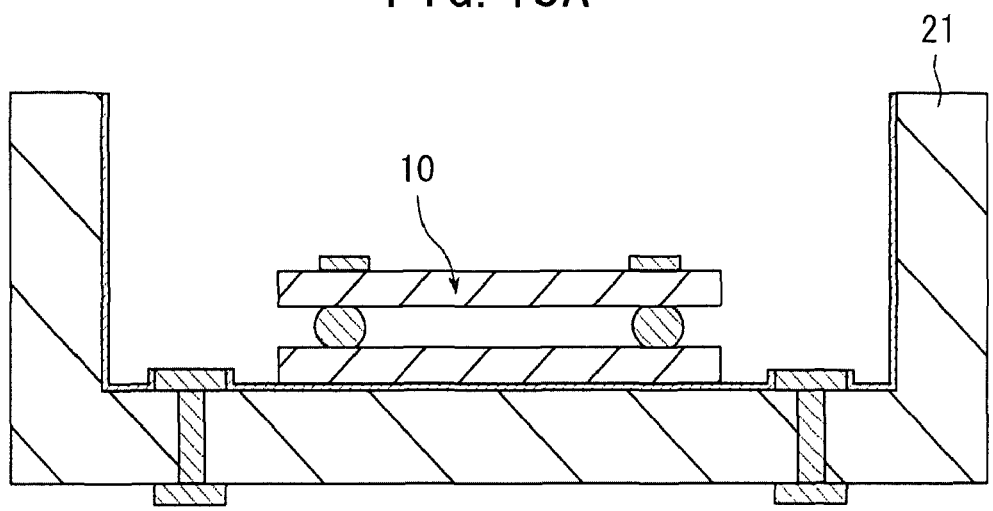
FIGS. 13A and 13B are diagrams showing steps following the one shown in FIG. 12B.
Figure 13B:
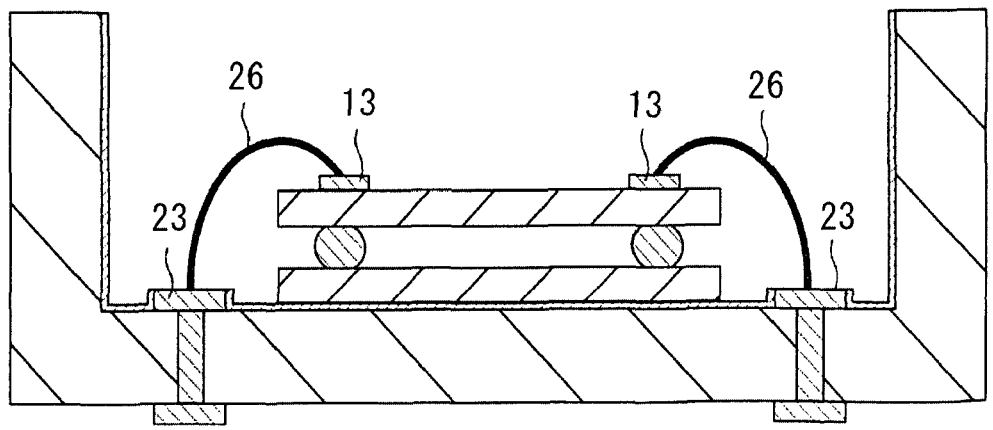

Then, as shown in FIG. 13A, the device chip 10 is mounted in the packaging member 21 (mounting step). A specific mounting technique is similar to that described for the first embodiment with reference to FIG. 5B. Then, as shown in FIG. 13B, the wires 26, connecting the electrode pads 13 and 23 together, are formed by, for example, wire bonding.

Figure 14A:
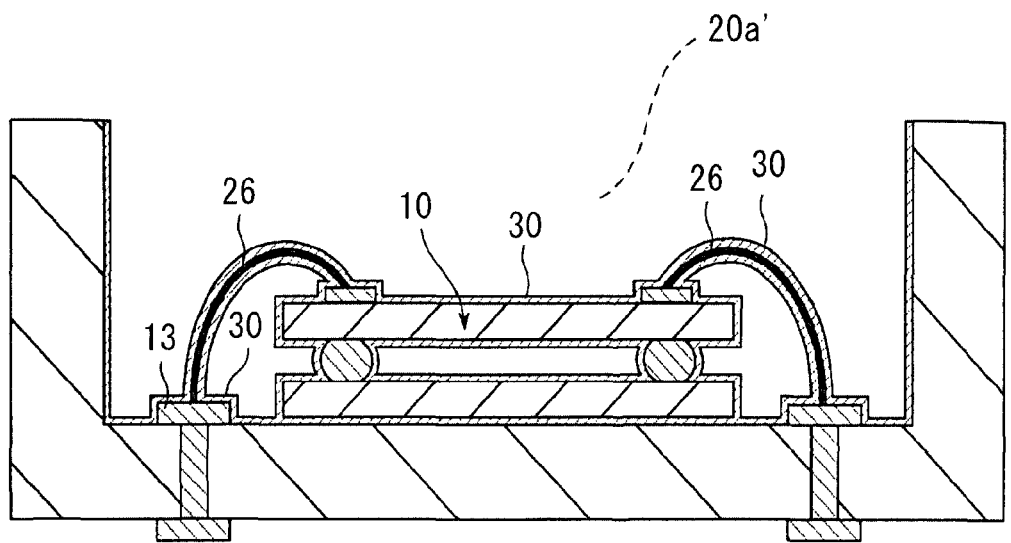
FIGS. 14A and 14B are diagrams showing steps following the one shown in FIG. 13B.
Figure 14B:
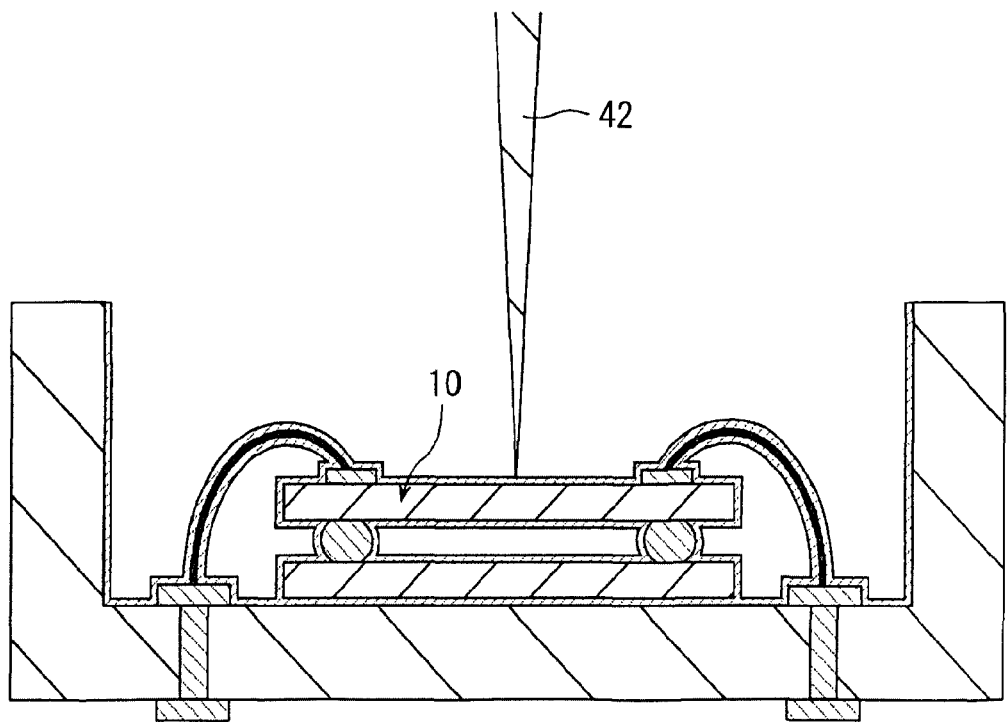

Then, as shown in FIG. 14A, parylene is vapor-deposited in the recess portion 20a' of the packaging member 21 to form the parylene film 30 coating the device chip 10, the electrode pads 23, and the wires 26 (second coating step). Then, a temporary support portions C', shown in FIG. 4B and coupling the frame F to the movable portion M in each of the micro member elements Y in the device chip 10, are cut away or removed by irradiation with a laser beam 42 (cutting step) as shown in FIG. 14B. Thus, as shown in FIG. 4A, the frame F and the movable portion M are coupled together only by the coupling portions C. This makes the movable portion M swingable around the axis A. A YAG laser can be adopted as the laser beam 42. The packaging members 21 and 22 are subsequently joined together (joining step). Specifically, the joining step is carried out as described above for the first aspect with reference to FIG. 7B.

The packaged device X2 can be manufactured as described above. The predetermined connectors each provided at the tip of the flexible cable are attached as required to a side of the packaged device X2 shown in FIG. 10. The connectors are electrically connected to the electrode pads 24 of the packaged device X2. Furthermore, in the present method, the cutting step described above with reference to FIG. 14B may be carried out after the mounting step described above with reference to FIG. 13A and before the second coating step described above with reference to FIG. 14A.

Figure 15A:
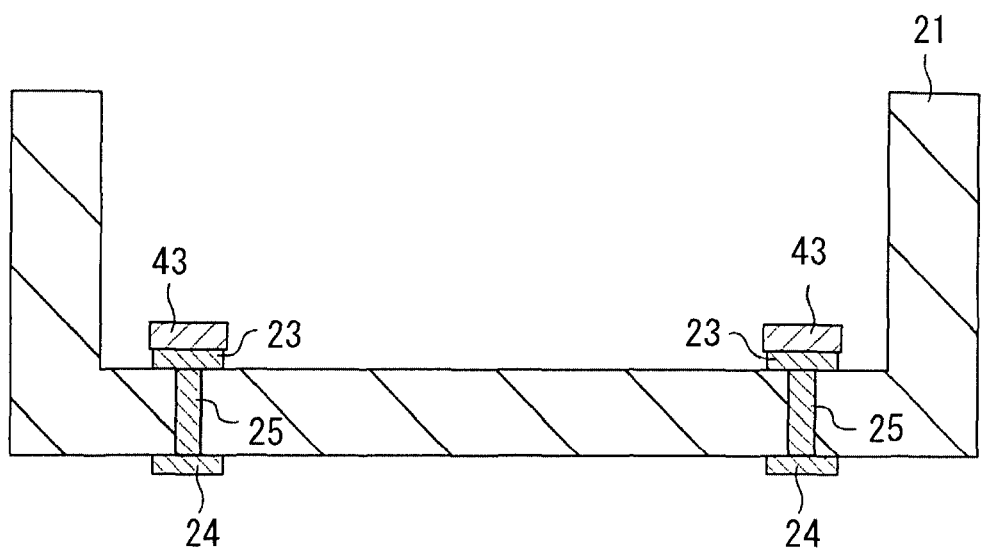
FIGS. 15A and 15B are diagrams showing steps of a second method of manufacturing the packaged device shown in FIG. 9.
Figure 15B:
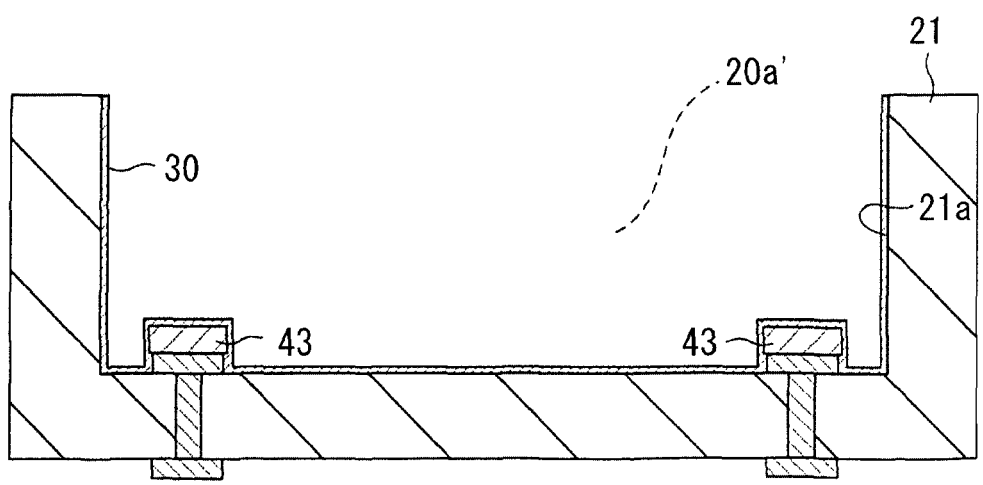

FIGS. 15 to 17 show a second method of manufacturing the packaged device X2. In the present manufacturing method, first, the electrode pads 23 and 24 and the plugs 25 are formed in the packaging member 21 as shown in FIG. 15A. Then, tapes 43 are stuck to the respective electrode pads 23. The capton tape P-221 (manufactured by Permacel) can be used as the tape 43. Then, as shown in FIG. 15B, parylene is vapor-deposited in the recess portion 20a' in the packaging member 21 to form the parylene member 30 (first coating step). In the present step, the parylene film 30 is not formed on the outer surface of the packaging member 21 or the junction surface between the packaging member 21 and the packaging member 22, or on the electrodes 23 in the recess portion 20a' of the packaging member 21.

Figure 16A:
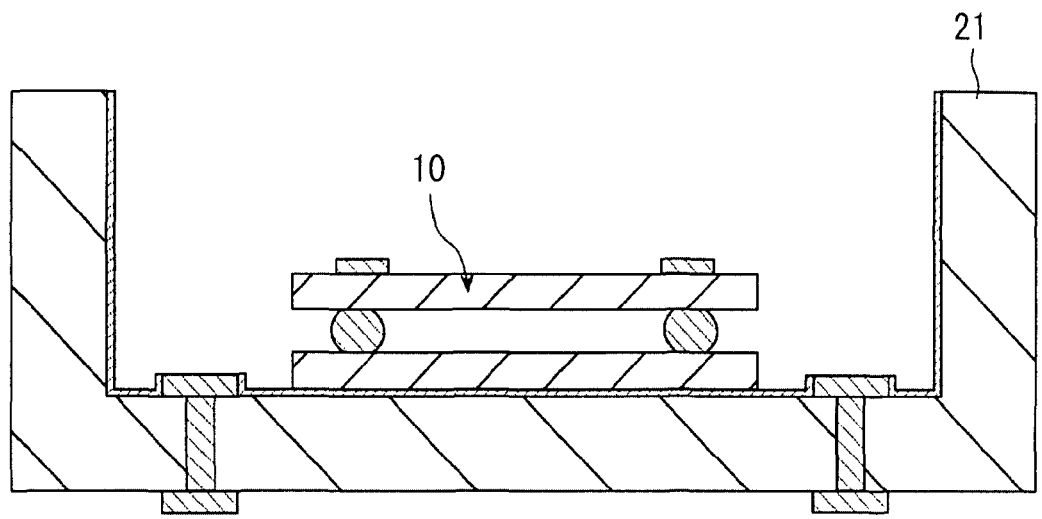
FIGS. 16A and 16B are diagrams showing steps following the one shown in FIG. 15B.
Figure 16B:
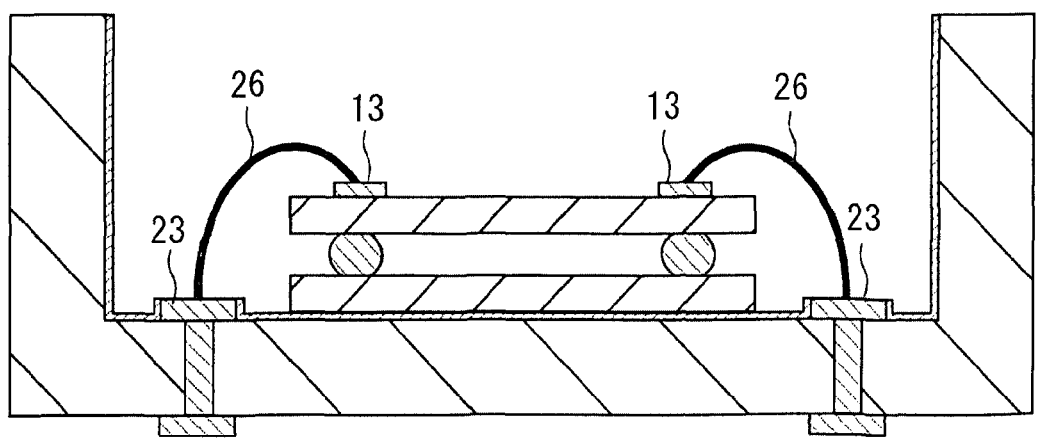

Then, the tapes 43 are peeled off, and as shown in FIG. 16A, the device chip 10 is mounted in the packaging member 21 (mounting step). A specific mounting technique is similar to that described for the first aspect with reference to FIG. 5B. Then, as shown in FIG. 16B, the wires 26, connecting the electrode pads 13 and 23 together, are formed by, for example, wire bonding.

Figure 17A:
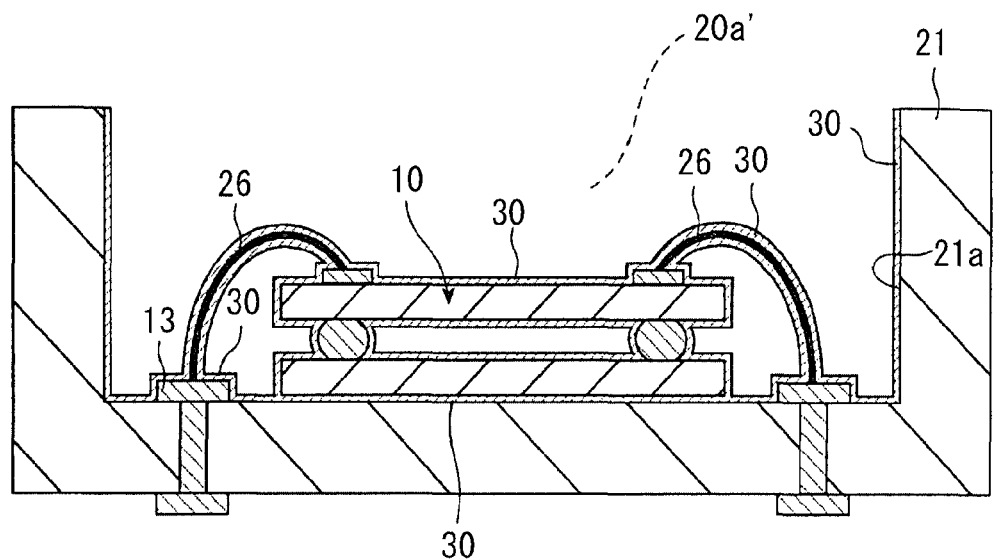
FIGS. 17A and 17B are diagrams showing steps following the one shown in FIG. 16B.
Figure 17B:
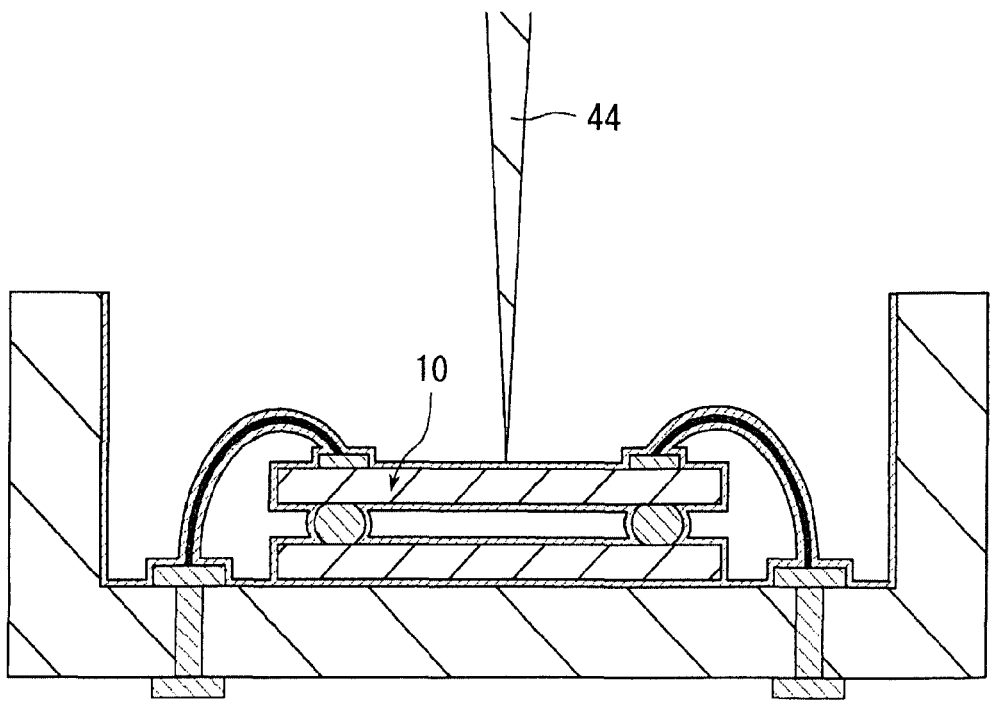

Then, as shown in FIG. 17A, parylene is vapor-deposited in the recess portion 20a' of the packaging member 21 to form the parylene film 30 coating the device chip 10, the electrode pads 23, and the wires 26 (second coating step). Then, the temporary support portions C', shown in FIG. 4B and coupling the frame F to the movable portion M in each of the micro member elements Y in the device chip 10, are cut away or removed by irradiation with a laser beam 44 (cutting step) as shown in FIG. 17B. Thus, as shown in FIG. 4A, the frame F and the movable portion M are coupled together only by the coupling portions C. This makes the movable portion M swingable around the axis A. A YAG laser can be adopted as the laser beam 44. The packaging members 21 and 22 are subsequently joined together (joining step). Specifically, the joining step is carried out as described above for the first aspect with reference to FIG. 7B.

The packaged device X2 can be manufactured as described above. The predetermined connectors each provided at the tip of the flexible cable are attached as required to a side of the packaged device X2 shown in FIG. 10. The connectors are electrically connected to the electrode pads 24 or the packaged device X2. Furthermore, in the present method, the cutting step described above with reference to FIG. 17B may be carried out after the mounting step described above with reference to FIG. 16A and before the second coating step described above with reference to FIG. 17A.

What is claimed is:

1. A method of manufacturing a packaged device, the method comprising:
    a mounting step of mounting a device chip in a recess portion of a package main body having an electrode pad in the recess portion;
    a connecting step of electrically connecting the device chip and the electrode pad together using a wiring component;
    a coating step of depositing parylene in the recess portion of the package main body; and
    a joining step of joining a cover over the recess portion of the package main body.

2. The method of manufacturing the packaged device according to claim 1, wherein the device chip mounted in the package main body in the mounting step has a micro movable element formed therein and including a fixed portion, a movable portion, and a temporary support portion coupling the fixed portion to the movable portion, and
    the method further comprises a cutting step of cutting the temporary support portion of the micro movable element, the cutting step being carried out after the coating step and before the joining step.

3. The method of manufacturing the packaged device according to claim 1, wherein the device chip mounted in the package main body in the mounting step has a micro movable element formed therein including a fixed portion, a movable portion, and a temporary support portion coupling the fixed portion to the movable portion, and
    the method further comprises a cutting step of cutting the temporary support portion of the micro movable element, the cutting step being carried out after the mounting step and before the coating step.

4. A method of manufacturing a packaged device, the method comprising:
    a step of vapor-depositing parylene in a recess portion of a package main body having an electrode pad in the recess portion;
    a step of removing the parylene from the electrode pad;
    a step of mounting a device chip in the recess portion of the package main body;
    a connecting step of electrically connecting the device chip and the electrode pad together using a wiring component; and
    a joining step of joining a cover over the recess portion of the package main body.

5. The method of manufacturing the packaged device according to claim 4, further comprising a step of vapor-depositing parylene in the recess portion of the package main body, the step being carried out after the connecting step and before the joining step.

6. The method of manufacturing the packaged device according to claim 4, wherein the device chip mounted in the package main body in the mounting step has a micro movable element formed therein including a fixed portion, a movable portion, and a temporary support portion coupling the fixed portion to the movable portion, and
    the method further comprises a cutting step of cutting the temporary support portion of the micro movable element, the cutting step being carried out between the mounting step and the joining step.

7. The method of manufacturing the packaged device according to claim 4, further comprising a step of vapor-depositing parylene on at least a part of a surface of the cover, the step being carried out before the joining step.

* * * * *